(12) United States Patent
Araki et al.

(10) Patent No.: US 6,821,930 B2
(45) Date of Patent: Nov. 23, 2004

(54) PREPARING METHOD OF OXIDE SUPERCONDUCTOR, RAW MATERIAL FOR OXIDE SUPERCONDUCTOR, AND PREPARING METHOD OF RAW MATERIAL FOR OXIDE SUPERCONDUCTOR

(75) Inventors: Takeshi Araki, Nagoya (JP); Katsuya Yamagiwa, Komaki (JP); Izumi Hirabayashi, Nagoya (JP)

(73) Assignees: Kabushiki Kaisha Toshiba, Tokyo (JP); International Superconductivity Technology Center, Tokyo (JP)

( * ) Notice: Subject to any disclaimer, the term of this patent is extended or adjusted under 35 U.S.C. 154(b) by 0 days.

(21) Appl. No.: 10/441,224

(22) Filed: May 20, 2003

(65) Prior Publication Data

US 2003/0198748 A1 Oct. 23, 2003

Related U.S. Application Data (63) Continuation of application No. 09/945,821, filed on Sep. 5, 2001, now Pat. No. 6,586,042.

(30) Foreign Application Priority Data

Sep. 5, 2000 (JP) .................................... P2000-269251

(51) Int. Cl.[7] .............................. H01L 39/24; B05D 5/12
(52) U.S. Cl. ..................... 505/440; 505/470; 427/62; 29/599
(58) Field of Search ............................... 427/62, 126.3; 505/441, 470; 29/599

(56) References Cited

U.S. PATENT DOCUMENTS

| | | | | |
|---|---|---|---|---|
| 4,866,031 A | * | 9/1989 | Bolt et al. ................. 505/445 |
| 4,983,577 A | * | 1/1991 | Mantese et al. ............ 505/445 |
| 5,231,074 A | * | 7/1993 | Cima et al. ................. 505/434 |
| 5,416,063 A | * | 5/1995 | Gross et al. ................ 505/470 |
| 5,480,862 A | * | 1/1996 | Miszenti .................... 505/440 |

FOREIGN PATENT DOCUMENTS

| | | |
|---|---|---|
| JP | 2002-201157 | 7/1902 |
| JP | 01-230405 | 9/1989 |
| JP | 01-320224 | 12/1989 |
| JP | 05-009022 | 1/1993 |
| JP | 2002-068900 | 3/2002 |
| WO | WO 98/58415 | 12/1998 |

OTHER PUBLICATIONS

J.A. Smith, M. J. Cima, and N. Sonnenberg, *High Critical Current Density Thick MOD–Derived YBCO Films*, IEEE Transactions on Applied Superconductivity, vol. 9, No. 2, Jun. 1999.

McIntyre et al., "Effect of Growth Conditions on the Properties and Morphology of Chemically Derived Epitaxial Thin Films of $Ba_2YCU_3O_{7-x}$ on (001) $LaAlO_3$," J. Appl. Phys. (Feb. 15, 1992), 71:1868–77.

* cited by examiner

Primary Examiner—Brian K. Talbot
(74) Attorney, Agent, or Firm—Finnegan, Henderson, Farabow, Garrett & Dunner, L.L.P.

(57) ABSTRACT

An aqueous solution of mixed metal acetate including one kind or more of element selected from lanthanide series and yttrium, barium and copper is mixed with trifluoroacetic acid to prepare a solution of mixed metal trifluoroacetate. From a solution of mixed metal trifluoroacetate obtained thus, purified mixed metal trifluoroacetate of which total content of water and acetic acid is 2% by weight or less is prepared. With purified mixed metal trifluoroacetate, an oxide superconductor of excellent performance may be prepared.

5 Claims, 6 Drawing Sheets

PREPARING METHOD OF OXIDE SUPERCONDUCTOR, RAW MATERIAL FOR OXIDE SUPERCONDUCTOR, AND PREPARING METHOD OF RAW MATERIAL FOR OXIDE SUPERCONDUCTOR

CROSS REFERENCE TO RELATED APPLICATIONS

This application is a Continuation of U.S. Ser. No. 09/945,821, filed Sep. 5, 2001, now U.S. Pat. No. 6,586,042.

This application is based upon and claims the benefit of priority from the prior Japanese Patent Application No. 2000-269251, filed on Sep. 5, 2000; the entire contents of which are incorporated herein by reference.

BACKGROUND OF THE INVENTION

1. Field of the Invention

The present invention relates to a method for preparing an oxide superconductor, a raw material for an oxide superconductor, and a method for preparing a raw material for an oxide superconductor. The present invention relates in particular to a method for preparing an oxide superconductor, a raw material for an oxide superconductor, and a method for preparing a raw material for an oxide superconductor, all employing a metal trifluoroacetate.

2. Description of the Related Art

Oxide superconductors are expected to use in a variety of applications such as superconducting coils, superconducting magnets, nuclear fusion reactors, magnetic levitation trains, accelerators, magnetic imaging systems (Magnetic Resonance Imaging systems or the like), superconducting magnetic energy storage or the like, some of these being put into practical use.

There are bismuth-based and yttrium-based superconductors in the oxide superconductors, due to few deterioration such as critical current density or the like even under a magnetic field, the yttrium-based superconductors drawing attention.

As the methods for preparing the yttrium-based superconductors, there are a variety of methods such as pulsed laser deposition, liquid phase epitaxy method and electron beam evaporation. Among these, metal organic deposition is attracting attention because it can disuse a vacuum and facilitates to prepare the oxide superconductors at low costs. Of the metal organic deposition, metal-organic deposition method using trifluoroacetates (hereafter refers to as "TFA-MOD method"), due to its simplicity, is drawing attention of its future.

As the TFA-MOD method, a method where metal acetate and water are starting materials has been tried by Gupta (cf. A. Gupta, et al, Appl. Phys. Lett. vol. 52 (No.24), page 2077 (1988)) or by McIntyreandcirma (cf. P. C. McIntyre, et al, Appl. Phys. vol. 68 (No.8), page 4183 (1990)).

SUMMARY OF THE INVENTION

The oxide superconductors are preferable to be high in performance (for instance, to be high in-the critical current density while having a certain thickness). However, it is difficult to prepare, from starting materials of metal acetate and water, an oxide superconductor which has for instance a thickness of 0.1 $\mu$m or more and exceeds 1 MA/cm$^2$ in the critical current density.

An object of the present invention is to provide a method or preparing an oxide superconductor that can make use of metal acetates as the starting material and exhibits high performance.

(1) A method for preparing an oxide superconductor involving one embodiment of the present invention includes:

mixing an aqueous solution of mixed metal acetate containing one kind or more metal element selected from lanthanide series and yttrium, barium and copper and trifluoroacetic acid to prepare an aqueous solution of mixed metal trifluoroacetate;

purifying the aqueous solution of mixed metal trifluoroacetate prepared according to the mixing to prepare purified mixed metal trifluoroacetate in which a total content of water and acetic acid is two % by weight or less;

dissolving the mixed metal trifluoroacetate prepared according to the purifying in a solvent to prepare a coating solution;

coating the coating solution prepared according to the dissolving on a base material to prepare a film of the mixed metal trifluoroacetate; and heating the base material thereon the film of the mixed metal trifluoroacetate is formed according to the coating to prepare a superconductor.

The total content of water and acetic acid of 2% by weight or less in the purified mixed metal trifluoroacetate enables to prepare the oxide superconductors of excellent performance.

The purifying may includes:

a first refining process in which the solution of mixed metal trifluoroacetate prepared according to the mixing is refined under a reduced pressure to prepare a first purified mixed metal trifluoroacetate in which water and acetic acid are reduced;

addition of a substance capable of replacing water and acetic acid in the first purified mixed metal trifluoroacetate to the first purified mixed metal trifluoroacetate prepared according to the first refining process; and a second refining process in which the first purified mixed metal trifluoroacetate thereto the replaceable substance is added according to the addition is refined under a reduced pressure to prepare the second purified mixed metal trifluoroacetate in which water and acetic acid are reduced.

In the-second purified mixed-metal trifluoroacetate prepared by adding the replaceable substance to the first purified mixed metal trifluoroacetate and by refining under a reduced pressure, larger part of the water and acetic acid in the first purified mixed metal trifluoroacetate is replaced by the replaceable substance. As a result, the total content of the water and acetic acid in the second purified mixed metal trifluoroacetate is reduced in comparison with that of the water and acetic acid in the first purified mixed metal trifluoroacetate. By the use of the second purified mixed metal trifluoroacetate, the superconductors of excellent performance may be formed.

(2) Raw material for an oxide superconductor involving one embodiment of the present invention includes:

mixed metal trifluoroacetate containing one kind or more metal selected from the lanthanide series and yttrium, barium and copper;

wherein the total content of water and acetic acid is 0.5% by weight or less with respect to the mixed metal trifluoroacetate.

In the raw material for oxide superconductor, metal acetates each may be mixed with an appropriate mixing ratio as demands arise. Thereby, the raw material for oxide superconductor may be used for preparing the oxide superconductor of Y123 system. The total content of the water and acetic acid of 0.5% by weight or less in the raw material enables to prepare the oxide superconductor of excellent performance.

(3) A method for preparing raw material for oxide superconductors involving one embodiment of the present invention includes:

mixing an aqueous solution of metal acetate containing one kind or more metal element selected from lanthanide series and yttrium, barium and copper with trifluoroacetic acid to prepare a solution of metal trifluoroacetate;

a first refining process of the metal trifluoroacetate solution prepared according to the mixing under a reduced pressure to prepare a first purified metal trifluoroacetate in which water and acetic acid are reduced;

adding a substance capable of replacing water and acetic acid in the first purified metal trifluoroacetate to the first purified metal trifluoroacetate prepared according to the. first refining process; and a second refining process of the first purified metal trifluoroacetate thereto the replaceable substance is added according to the addition under a reduced pressure to prepare a second purified metal trifluoroacetate in which the total content of water and acetic acid is 2% by weight or less.

By means of the first refining process, the addition, and the second refining process, the second purified metal trifluoroacetate is prepared to be 2% by weight or less in the total content of water and acetic acid, being used as mixed raw material for preparing a superconductor of excellent performance.

BRIEF DESCRIPTION OF THE DRAWINGS

The invention is described with reference to the Drawings, which are presented for the purpose of illustration only and are in no way limiting of the invention.

DETAILED DESCRIPTION OF THE INVENTION

In the following, implementation modes of the present invention will be detailed with reference to the drawings.
(First Implementation Mode)

Figure 1:
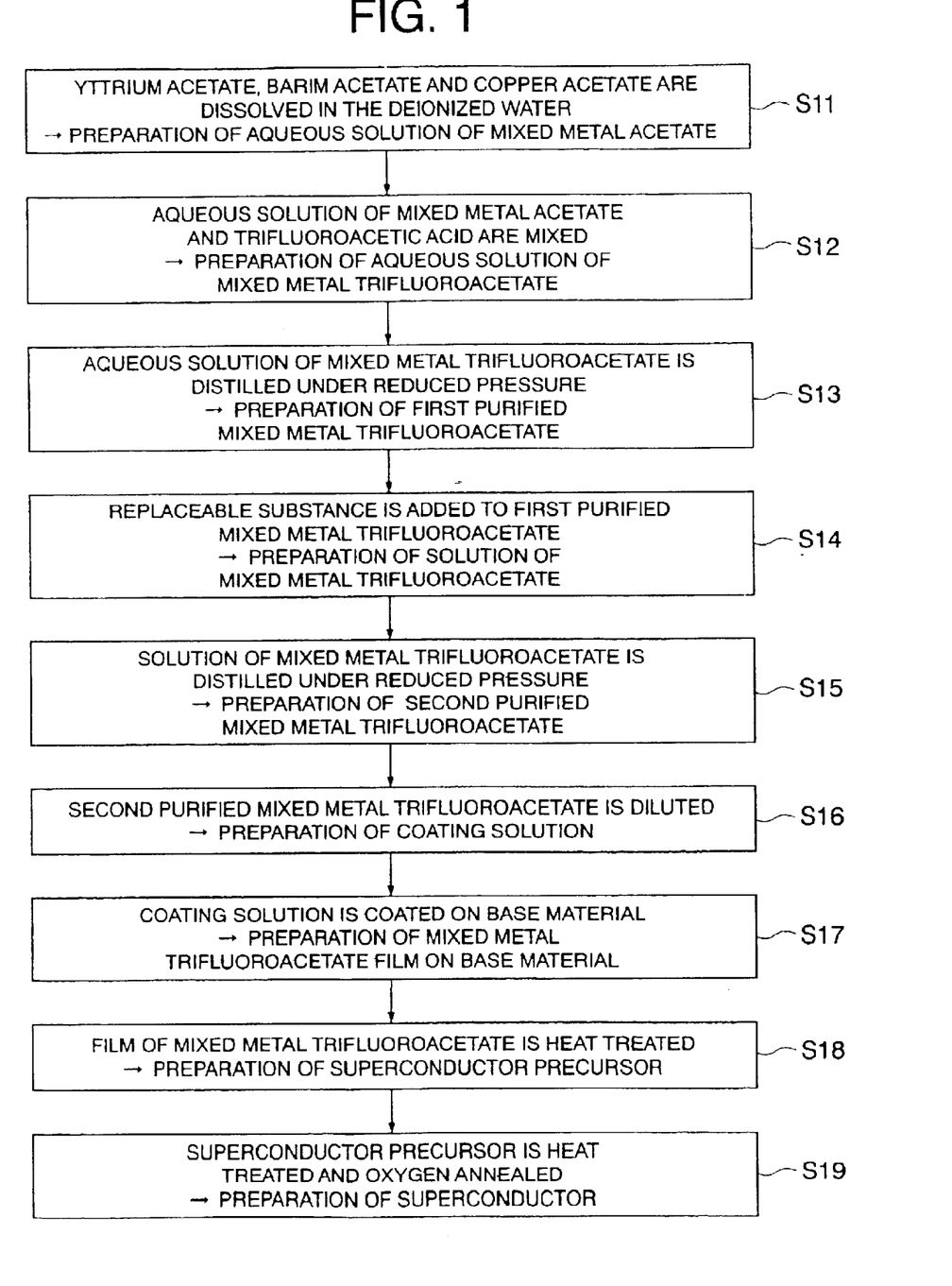
FIG. 1 is a flow chart showing a method for preparing an oxide superconductor involving a first implementation mode of the present invention.

FIG. 1 is a flow chart showing a method for preparing an oxide superconductor involving a first implementation mode of the present invention. As shown in FIG. 1, the method for preparing an oxide superconductor involving the present implementation mode includes steps 11 through 19. In the following, with reference to FIG. 1, the method for preparing an oxide superconductor involving the first implementation mode of the present invention will be explained.

(1) Acetate containing one kind or more of metal element selected from lanthanide series and yttrium (Y), barium and copper is dissolved in water to prepare a solution of mixed metal acetate (step S11).

In FIG. 1, yttrium (Y) is selected as "one kind or more metal element selected from lanthanide series and yttrium" for illustration. In all of the following steps 12 through 19, "yttrium" also shows a representative example of "one kind or more metal element selected from lanthanide series and yttrium".

The "lanthanide series" denotes a group of elements from lanthanum of atomic number 57 to lutetium of atomic number 71, including neodymium (Nd), samarium (Sm), gadolinium (Gd), and ytterbium (Yb), for instance. Accordingly, as "one kind or more metal element selected from lanthanide series and yttrium", samarium (Sm) or a mixture of samarium and yttrium for instance may be contained.

In view of obtaining the oxide superconductor of excellent performance, acetates each of the "one kind or more of metal element", barium and copper are preferably mixed with a ratio of 1:2:3 in terms of molar ratio of the respective metal ions. This is based on a crystalline structure of so-called Y123 system oxide superconductor (for instance, $Ba_2YCu_3O_7$). As light deviation from this ratio is acceptable.

As "water", deionized water prepared by the use of an ion exchange method or the like for instance is preferably used to suppress impurities from mingling.

As one example, powders of hydrates each of yttrium acetate $(Y(OCOCH_3)_3)$, barium acetate $(Ba(OCOCH_3)_2)$ and copper acetate $(CU(OCOCH_3)_2)$ are dissolved in deionized water to prepare an aqueous solution of mixed metal acetate in which Y, Ba and Cu ions are contained in a mole ratio of approximately 1:2:3.

(2) The aqueous solution of mixed metal acetate is mixed with trifluoroacetic acid $(CF_3COOH)$ to prepare an aqueous solution of mixed metal trifluoroacetate (step S12).

As a result of mixing of the solutions, ions of "one or more kind of metal element" (yttrium and so on), barium and copper react with trifluoroacetic acid to form a solution of mixed metal trifluoroacetate including yttrium trifluoroacetate $((CF_3COO)_3Y)$, Barium trifluoroacetate $((CF_3COO)_2Ba)$, and copper trifluoroacetate $((CF_3COO)_2Cu)$, for instance.

An amount of the trifluoroacetate to be mixed at that time is preferable to be equivalent mole base (equivalent moles each react with no remaining molecule) with the acetate so that all acetate groups of the acetate are replaced by the trifluoroacetate groups.

(3) The aqueous solution of the mixed metal trifluoroacetate is distilled (refined) under a reduced pressure to prepare a first purified mixed metal trifluoroacetate (step S13).

A vessel with the solution inside, while depressurizing by the use of a rotary evaporator or the like for instance, is heated to distill (remove) water and acetic acid from the solution of the mixed metal trifluoroacetate. It is desirable to distill while rotating the vessel with the solution inside in view of preparing a homogeneous first purified mixed metal trifluoroacetate.

By appropriately adjusting a pressure and a temperature during the distillation (refining process), bumping can be suppressed from occurring and residual water and acetic acid are removed as much as possible. For instance, at the initial stage of the distillation, a pressure is set at 120 hPa and a temperature is set at 40° C. As the water and acetic acid decrease, the pressure is gradually decreased and the temperature is also gradually raised. The distillation time at that time is approximately 8 hr, for instance.

As a result, semitransparent and blue gel or sol of the first purified mixed metal trifluoroacetate may be obtained. In the first purified mixed metal trifluoroacetate, the water and acetic acid that could not be evaporated are contained by the total content of for instance approximately from 2 to 8% by weight.

(4) To the first purified mixed metal trifluoroacetate, a substance replaceable with the acetic acid in the first purified mixed metal trifluoroacetate is added to prepare a solution of mixed metal trifluoroacetate (step S14).

The mixed metal trifluoroacetate exists in gel or sol state, molecules each of metal trifluoroacetate such as yttrium trifluoroacetate or the like make access to each other due to 10 hydrogen bond or the like to combine, and water molecules and acetic acid molecules are physically or electrostatically bound in the gap therebetween. This is why the water molecules and acetic acid molecules are difficult to be removed completely.

By removing the water and acetic acid from the mixed metal trifluoroacetate, the oxide superconductor of excellent performance may be obtained. That is, the insufficient removal of the water may result in a difficulty in coating the mixed metal trifluoroacetate on a base material. In addition, remaining acetic acid results in residual carbon in the oxide superconductor during the preparation thereof to tend to lower the critical current density.

In order to remove the water and acetic acid, to the first purified mixed metal trifluoroacetate, a substance replaceable with the water and acetic acid therein is added. By performing a second distillation in the subsequent step S15, the replaceable substance replaces the water and acetic acid in the purified mixed metal trifluoroacetate to reduce the water and acetic acid in the mixed metal trifluoroacetate.

The replaceable substance, in addition to being capable of replacing the water and acetic acid in the purified mixed metal trifluoroacetate, have necessity of difficulty in reacting with the mixed metal trifluoroacetate and lead to no reminder in the superconductor during the preparation of the superconductor. Accordingly, as the replaceable substances, lower hydrocarbon compounds that are liquid under room temperature and ambient pressure (30° C. and 1013 hPa), for instance methanol, ethanol, 1-propanol, 2-propanol or the like may be selected.

The reason that replaceable substances are necessary to be lower hydrocarbons is as follows. That is, when hydrocarbon compounds abundant in the number of carbon are used, at the preparation of a superconductor precursor in the step S18 described below, the carbon tends to remain in the superconductor precursor. The residual carbon in the superconductor precursor, resultantly in the superconductor, may cause deterioration of the superconductor characteristics.

The replaceable substance is added by a sufficiently larger amount than the total content of the water and acetic acid remaining in the mixed metal trifluoroacetate, for instance by from 50 to 200 times the total weight of the remaining water and acetic acid to prepare a solution of the mixed metal trifluoroacetate. As a result, the total content by weight % of the water and acetic acid in the mixed metal trifluoroacetate solution decreases to from $1/50$ to $1/200$ that of the mixed metal trifluoroacetate prepared in the step S13.

(5) The first purified mixed metal trifluoroacetate thereto the replaceable substance is added is distilled under a reduced pressure to prepare a second purified mixed metal trifluoroacetate (step S15).

For instance, by heating while reducing the pressure in the vessel therein the solution is poured by means of the rotary evaporator, the mixed metal trifluoroacetate solution is distilled to remove the water and acetic acid.

At that time, the pressure and the temperature are appropriately controlled according to material of the replaceable substance so that the water and acetic acid can evaporate as easily as possible. When methanol is used as the replaceable substance for instance, at the initial stage of the distillation, the pressure is set at 240 hPa and the temperature is set at 35° C., as the water and acetic acid evaporate, gradually the pressure is reduced and the temperature is raised.

In the case of methanol is used as the replaceable substance for instance, its boiling point is lower than those of water and acetic acid. Accordingly, methanol vaporizes more than water and acetic acid from the mixed metal trifluoroacetate solution. However, as methanol vaporizes, the water and acetic acid also vaporize. As a result, with the distillation process, the water and acetic acid in the mixed metal trifluoroacetate solution decrease.

The distilling the water while rotating the vessel with the solution therein is preferably performed in view of preparing homogeneous second purified mixed metal trifluoroacetate.

As described above, as a result of steps S14 and S15, the water and acetic acid are removed from the first purified mixed metal trifluoroacetate, thereby a second purified mixed metal trifluoroacetate being prepared.

The second purified mixed metal trifluoroacetate is a semitransparent blue gel-like or sol-like substance, in the gaps of mutually bonded metal trifluoroacetate molecules, molecules of the replaceable substance such as methanol or the like, furthermore water and acetic acid molecules being present.

However, in the second purified mixed metal trifluoroacetate, the water and acetic acid contained in the first purified mixed metal trifluoroacetate are largely replaced by the replaceable substance. Accordingly, the contents of the water and acetic acid are decreased in comparison with the first purified mixed metal trifluoroacetate. For instance, assuming that the total content of the water and acetic acid in the first purified mixed metal trifluoroacetate is 8% by weight and 90% thereof is replaced by the replaceable substance, the total content of the water and acetic acid in the second purified mixed metal trifluoroacetate will be 8×0.1=0.8% by weight.

Thus, it is possible to make the total content of the water and acetic acid in the second purified mixed metal trifluoroacetate 2% by weight or less. As a result, by the use of the second purified mixed metal trifluoroacetate, the superconductor with excellent performance may be prepared.

Actually, since the water and acetic acid can be replaced by the replaceable substance with a rate of 90% or more, it is possible to satisfy that the total content of the water and acetic acid in the second purified mixed metal trifluoroacetate is less than 0.5% by weight.

(6) The second purified mixed metal trifluoroacetate is diluted with a solvent to prepare a coating solution (step S16).

As the solvents, hydrocarbons that are liquid at room temperature and ambient pressure (30° C. and 1013 hPa), that is lower hydrocarbons such as methanol, ethanol, 1-propanol and 2-propanol for instance may be used. The necessity of lower hydrocarbons comes from that when the superconductor precursor is prepared in the step 18 below described, hydrocarbons abundant in the number of carbon tend to cause a large amount of residual carbon. The residual carbon in the superconductor precursor, may cause the superconductor with poor superconducting properties.

In diluting, the extent of dilution is adjusted to prepare a coating solution of appropriate viscosity. It is because a film of mixed metal trifluoroacetate is coated in a desired thickness on the base material. That is, an amount of solvent to be added is adjusted so that when preparing a thicker film, the viscosity is made larger, when preparing the thinner film, the viscosity being made smaller.

(7) The coating solution is coated on the base material to prepare a film of mixed metal trifluoroacetate (step S17).

As the base material, at least part of a surface thereof is preferable to be formed of material that is within ±7% in lattice mismatch with the oxide superconductor and is chemically compatible to water vapor and hydrogen fluoride.

In the present oxide superconductor, a crystalline structure of Y123 is necessary to exhibit the superconductivity. Accordingly, to grow crystal of the Y123 structure on the base material, it is preferable to be lattice matched with this crystalline structure.

Furthermore, in the steps of preparation of the superconductor described below (steps S18 and S19), humidity is used, and in step S19 as a result of the decomposition of the superconductor precursor, fluorides such as hydrogen fluoride or the like are evolved. Accordingly, the base material is preferable to be made of the material that is chemically compatible to the water and fluorides such as hydrogen fluoride or the like.

As examples of the materials satisfying the above conditions, (a) (100) oriented $LaAlO_3$, (b) (100) oriented magnesia (MgO) having a cap layer of crystalline ceria ($Ceo_2$), or (c) (100) oriented yttria stabilized zirconia (YSZ) having a surface of crystalline ceria can be cited.

The crystalline ceria in (b) and (c) is lattice matched with a lattice of the Y123 crystal structure in a direction of 45 degrees from a lattice direction of the surface. Such lattice matching does not necessarily mean matching of lattice spacing. Irrespective of an original lattice direction, when the spacing between lattices is matched, the lattices each are said to be mutually lattice-matched.

In coating the coating solution onto the base material, for instance spin coating where the coating solution is dripped onto the base material and the base material is spun to coat, dip coating where the base material is dipped in the coating solution followed by pulling up, and so on can be applied. At that time, for instance in the case of the spin coating, a spinning rate and an accelerating time of the base material are adjusted to control a thickness of the mixed metal trifluoroacetate film.

The use of the solvent with high vaporizing pressure such as methanol or the like allows for the solvent to evaporate during the spin coating, resulting in disuse of particular step for drying.

(8) The mixed metal trifluoroacetate is heat treated to prepare a superconductor precursor (step S18).

The heating is performed in a state where the base material thereon the film of mixed metal trifluoroacetate is coated is placed in a heating furnace and the inside of the heating furnace is made a humidified oxygen atmosphere.

Figure 2:
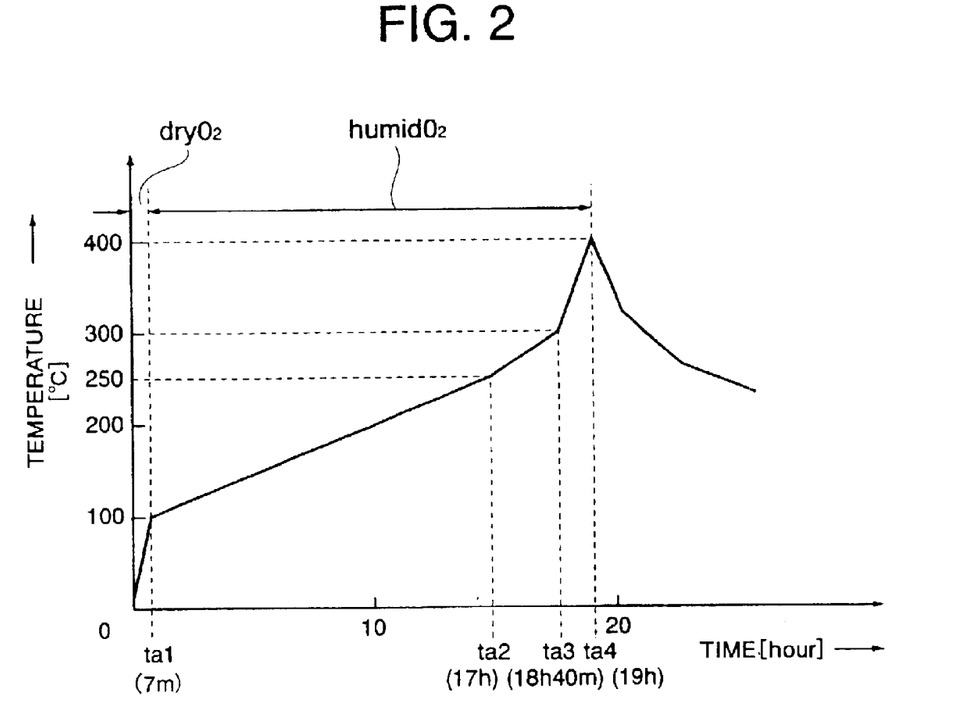
FIG. 2 is a graph showing one example of relationship between time and temperature when a film of mixed metal trifluoroacetate is heat treated to prepare a superconductor precursor.

FIG. 2 is one example showing relationship between time and temperature during the heat treatment.

(a) During from time zero to time ta1 (approximately 7 min after the commencement of heating), the temperature in the heating furnace is rapidly raised from room temperature to 100° C. At this time, the inside of the heating furnace is in a dry oxygen atmosphere of ambient pressure. All heating process hereafter may be performed under ambient pressure.

(b) When time ta1 is reached, the atmosphere in the heating furnace is switched to a humidified pure oxygen atmosphere of ambient pressure. During from time ta1 to ta2 (approximately 17 hr after the commencement of the heating), the temperature in the heating furnace is raised from 100° C. to 250° C.

At this time, humidity of the humidified pure oxygen atmosphere is set in the range from 4.2 to 12.1% for instance. By allowing bubbles of atmosphere gas (oxygen gas) to go through water at a predetermined temperature, the humidity can be controlled. That is, the humidity is determined by saturated vapor pressure in the bubbles when going through the water, the saturated vapor pressure being determined by the temperature.

(c) During from time ta2 to ta3 (approximately one hr and 40 min), the temperature inside the furnace is raised from 250° C. to 300° C., followed by further raising to 400° C. during from time ta3 to ta4 (approximately 20 min). At this time too, the atmosphere in the heating furnace is maintained in the humidified pure oxygen atmosphere. After the time ta4, the heating furnace is let to self-cool. At this time, inflow of the atmosphere gas is stopped but the humidified oxygen gas stays as the atmosphere gas.

As a result of the above heat treatment, trifluoroacetic acid component of the mixed metal trifluoroacetate is decomposed to form the superconductor precursor. Specifically, the following reactions occur, for instance.

$$(CF_3COO)_3Y \rightarrow YF_3 \text{ or } YOF$$

$$(CF_3COO)_2Ba \rightarrow BaF_2$$

$$(CF_3COO)_2Cu \rightarrow CuO$$

At that time, since the trifluoroacetic acid component decomposes as gaseous component, carbon element hardly remains in the superconductor precursor.

(9) The superconductor precursor is heat treated and oxygen annealed to prepare a superconductor (step S19).

By allowing the atmosphere gas to contain water vapor during the heat treatment, fluorides in the superconductor precursor (for instance, $YF_3$ or YOF, $BaF_2$, CuO) react with moisture in the following ways to evolve hydrogen fluoride, becoming oxides.

$$2YF_3+3H_2O \rightarrow Y_2O_3+6HF\uparrow$$

$$(2YOF+H_2O \rightarrow Y_2O_3+2HF\uparrow)$$

$$BaF_2+H_2O \rightarrow BaO+2HF\uparrow$$

These oxides immediately form $Ba_2YCu_3O_{6.5}$. To the oxide $Ba_2YCu_3O_{6.5}$, oxygen annealing is applied to adjust an amount of oxygen, thereby generating $Ba_2YCu_3O_7$ that is a Y123 based oxide superconductor.

Figure 3:
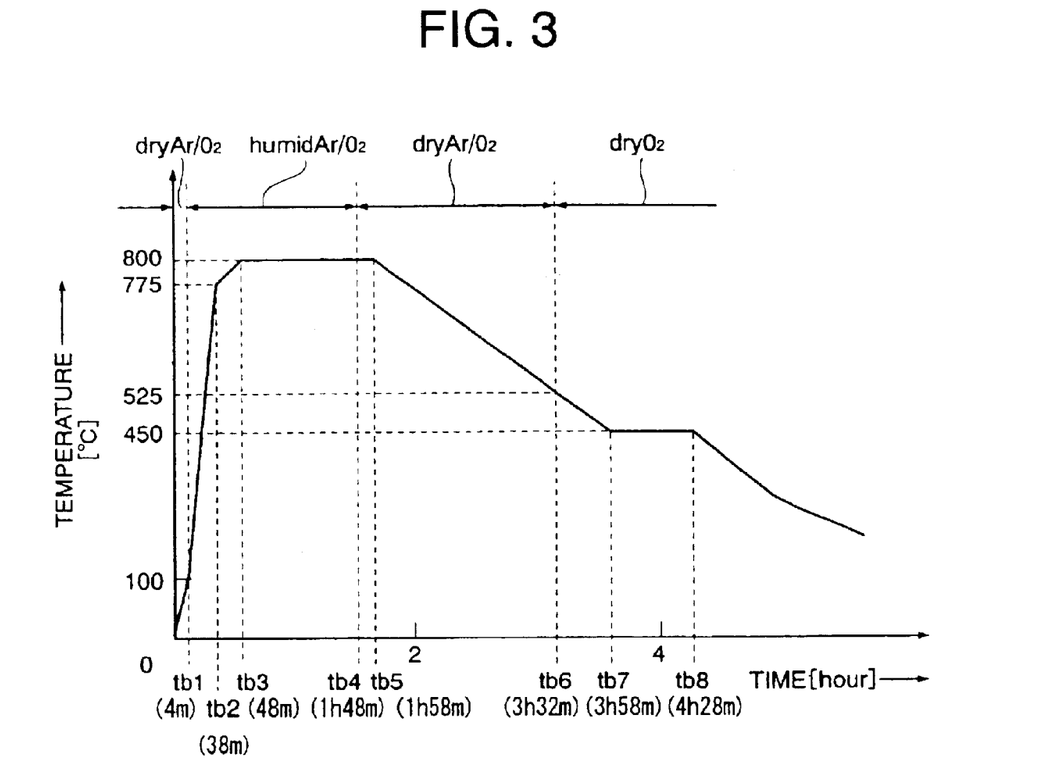
FIG. 3 is a graph showing one example of relationship between time and temperature when a superconductor precursor is heat treated and oxygen annealed to prepare a superconductor.

FIG. 3 is one example of a graph showing relationship between time and temperature during heat treatment and annealing.

(a) upon starting the heat treatment, the inside of the heating furnace is raised from room temperature. At that time, at the initial stage of heating process, the heating furnace is filled (until time tb1 (for instance, approximately 4 min after the commencement of the heat treatment, temperature 100° C.) with a dry mixture gas in which 1000 ppm of oxygen gas is mixed with an inert gas (it can be nitrogen gas, the same in the following) such as Ar gas or the like.

The mixture gas here may be ambient pressure, the following heat treatment and oxygen annealing being the same with this point.

The oxygen concentration of 1000 ppm and treatment time of 4 min and so on here are only for illustration, treatment under other conditions being also possible. The following heat treatment process and so on are the same in this point.

(b) At time tb1, the atmosphere gas is switched to a mixture gas of humidified inert gas and oxygen (relative humidity: 4.2 to 12.1%, mixed oxygen: 1000 ppm). Thereafter, the temperature in the heating furnace is raised up to 775° C. at time tb2 (approximately 38 min after the commencement of the heat treatment), being raised further up to 800° C. during from time tb2 to tb3 (approximately 10 min), being kept constant there during from time tb3 to tb4 (approximately one hr).

Since the atmosphere gas is humidified, the water used to decompose the superconductor precursor is supplied therefrom.

(c) At time tb4, the atmosphere gas is once more switched to a mixture gas of dry inert gas and oxygen gas (1000 ppm of oxygen being mixed, ambient pressure). Thereafter, during from time tb4 to tb5 (approximately 10 min), the temperature inside the heating furnace is further kept at 800° C., followed by gradual lowering to 525° C. at time tb6 (approximately 3 hr 32 min after the commencement of the heating).

The above from (a) to (c) is the heat treatment process, in the meantime the superconductor precursor reacts with water to decompose into oxides with evolution of hydrogen fluoride, from these oxides $Ba_2YCu_3O_{6.5}$ being immediately formed.

(d) At time tb6, the atmosphere gas is switched to a dry oxygen gas of ambient pressure to start oxygen annealing.

During from time tb6 to tb7 (approximately 26 min), at the similar pace as during from the time tb5 to tb6, the temperature is lowered to be 450° C. at the time tb7.

During from time tb7 to tb8 (approximately 30 min), the temperature is kept at 450° C., thereby oxygen annealing being further proceeded. At time tb8 (approximately 4 hr and 28 min after the commencement of the heat treatment), the oxygen annealing is over, the furnace being let to cool. During the cooling, the dry oxygen atmosphere is kept.

(Second Implementation Mode)

Figure 4:
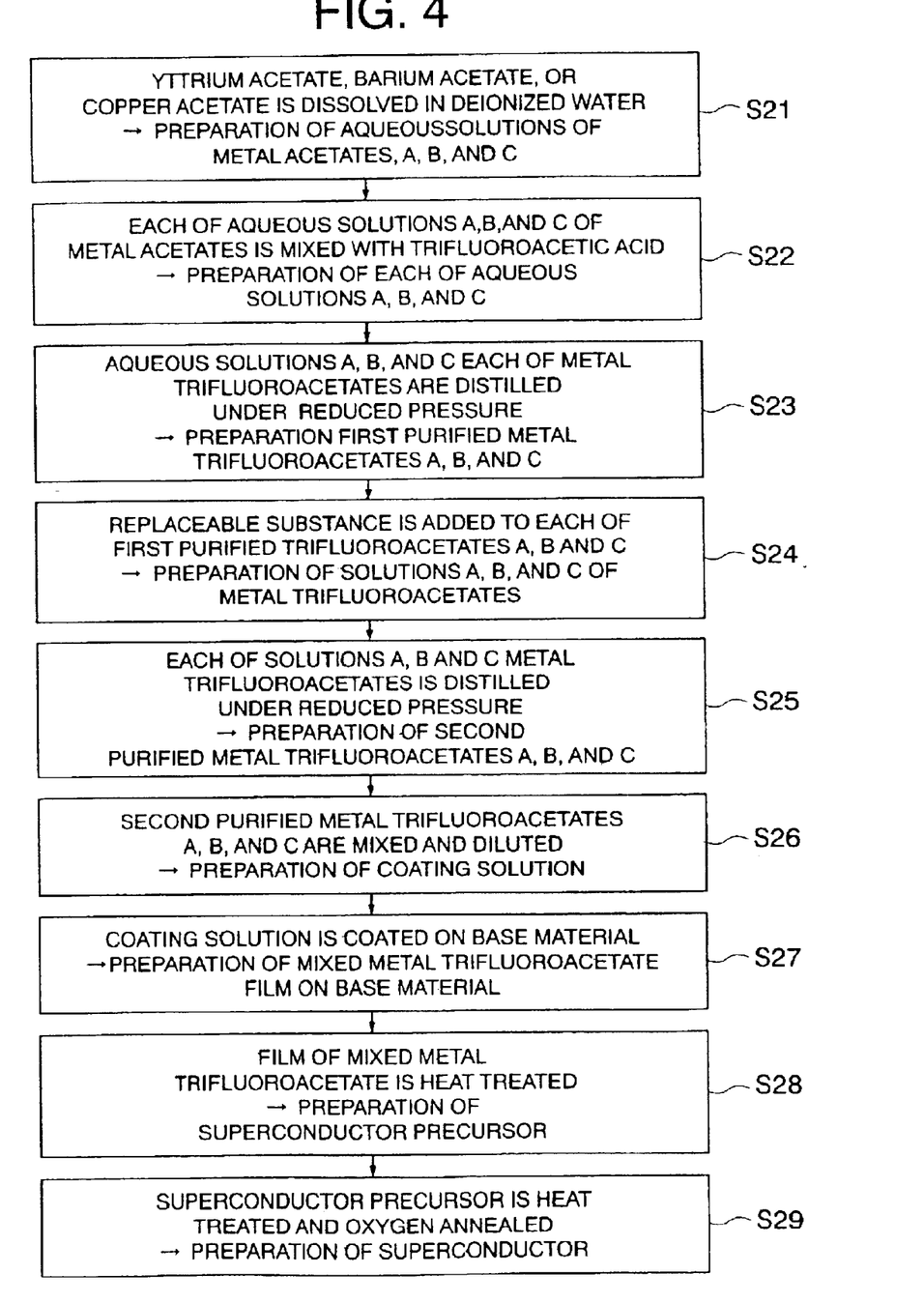
FIG. 4 is a flow chart showing a method for preparing an oxide superconductor involving a second implementation mode of the present invention.

FIG. 4 is a flowchart showing a method for preparing an oxide superconductor involving a second implementation mode of the present invention. Steps S21 through S29 shown in the flowchart correspond to the steps S11 through S19 shown in FIG. 1, respectively.

In the present implementation mode, yttrium also is the representative of "at least one kind or more metallic elements selected from lanthanide series and yttrium (Y)". In the present implementation mode, instep 521, yttrium acetate, barium acetate and copper acetate are separately dissolved in water to prepare three kinds of aqueous solutions of metal-acetates, A, B and C. Also thereafter, in steps S22 through S25, metal trifluoroacetates A, B and C, first metal trifluoroacetates A, B and C, and second metal trifluoroacetates A, B and C are separately prepared. In step S26, the second metal trifluoroacetates A, B and C are mixed to prepare a coating solution.

That is, the present implementation mode is different from the first implementation mode in that yttrium, barium and copper are separately treated during steps S21 through S25, at step 26 being mixed.

Thus, by separately purifying yttrium trifluoroacetate and so on and by mixing immediately before the preparation of the coating solution, an oxide superconductor may be formed.

The present implementation mode is not particularly different other than this from the first implementation mode. Accordingly, the explanation will be omitted.

(Embodiments)

In the following, embodiments of the present invention will be shown.

(1) Embodiment 1

Powders of hydrates of yttrium acetate ($Y(OCOCH_3)_3$), barium acetate ($Ba(OCOCH_3)_2$) and copper acetate ($Cu(OCOCH_3)_2$) are dissolved in deionized water with a respective molar ratio of 1:2:3 (corresponding to the step S11 of FIG. 1, the same here after), being mixed with equivalent mole of trifluoroacetic acid, followed by agitation to obtain a solution of mixed metal trifluoroacetate in which molar ratio of Y, Ba and Cu ions is 1:2:3 (step S12).

The obtained solution of mixed metal trifluoroacetate is poured into an egg plant type flask and distilled for 12 hr while depressurizing by means of a rotary evaporator, thereby obtaining semitransparent blue gel or sol of a first purified mixed metal trifluoroacetate (step S13).

The total content of water and acetic acid constituting the sol or gel of the first purified mixed metal trifluoroacetate (approximately from 2 to 8% by weight with respect to the first purified mixed metal trifluoroacetate) is measured by measuring the weight of the first purified mixed metal trifluoroacetate. Then, methanol (replaceable substance) corresponding to 100 times by weight the total content is added to dissolve the first purified mixed metal trifluoroacetate to prepare a solution of mixed metal trifluoroacetate (step S14). The solution is distilled for 8 hr under a reduced pressure in the rotary evaporator to obtain a second purified mixed metal trifluoroacetate made of semitransparent blue gel or sol (step S15).

The obtained second purified mixed metal trifluoroacetate is dissolved in methanol as the solvent, thereby preparing coating solutions of 1.52 M (mol/l), 2.34 M and 2.78 M in terms of metal ion, respectively (step S16).

Each of the coating solutions of the respective concentrations is coated, by means of spin coating, on a single crystal $LaAlO_3$ substrate oriented in (100) as the base material. The conditions for spin coating are an accelerating time of 0.4 sec, a spinning rate of 4000 rpm and holding time of the rotation of 120 sec. Drying is followed to form a film (step S17).

Under the temperature conditions shown in FIG. 2, in 4.2% humidified atmosphere, the heat treatment is performed to prepare a superconductor precursor (step S18).

Thereafter, under the temperature conditions shown in FIG. 3, in the 4.2% humidified mixed gas atmosphere in which 1000 ppm oxygen is mixed in argon, the heat treatment is performed, followed by the oxygen annealing in the dry pure oxygen atmosphere, thereby preparing a superconductor (step S19).

with the obtained superconductor, X-ray diffraction is carried out to identify a phase of crystallographic orientation and to analyze a preferential orientation. In addition, by means of DC four probe method, a critical current (Ic) at 77 K and zero T magnetic field is measured, the obtained value being divided by a cross sectional area of the superconductor film to obtain a critical current density (Jc). The cross sectional area of the superconductor film is calculated by dividing a total amount of the superconductor film obtained by ICP (Induced Coupled Plasma) spectroscopy by a surface area of the superconductor film.

Figure 5:
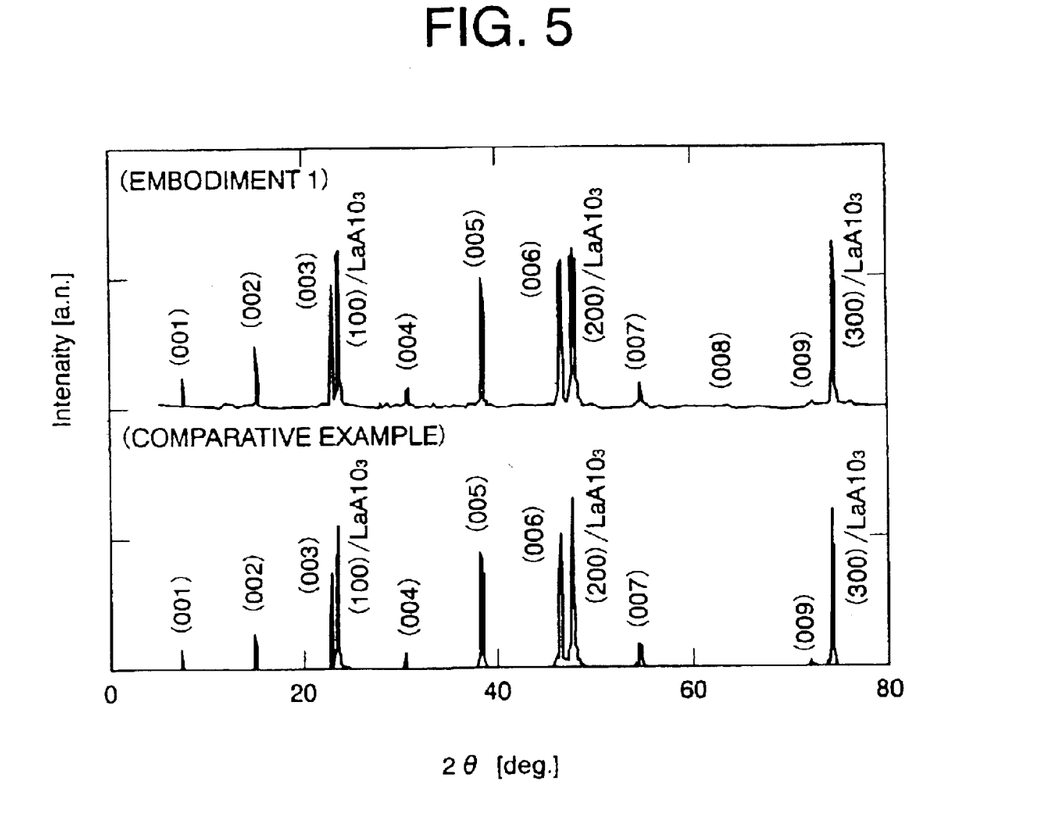
FIG. 5 is a graph showing measurements of X-ray diffraction in one embodiment of the present invention in comparison with that of a comparative example.
Figure 6:
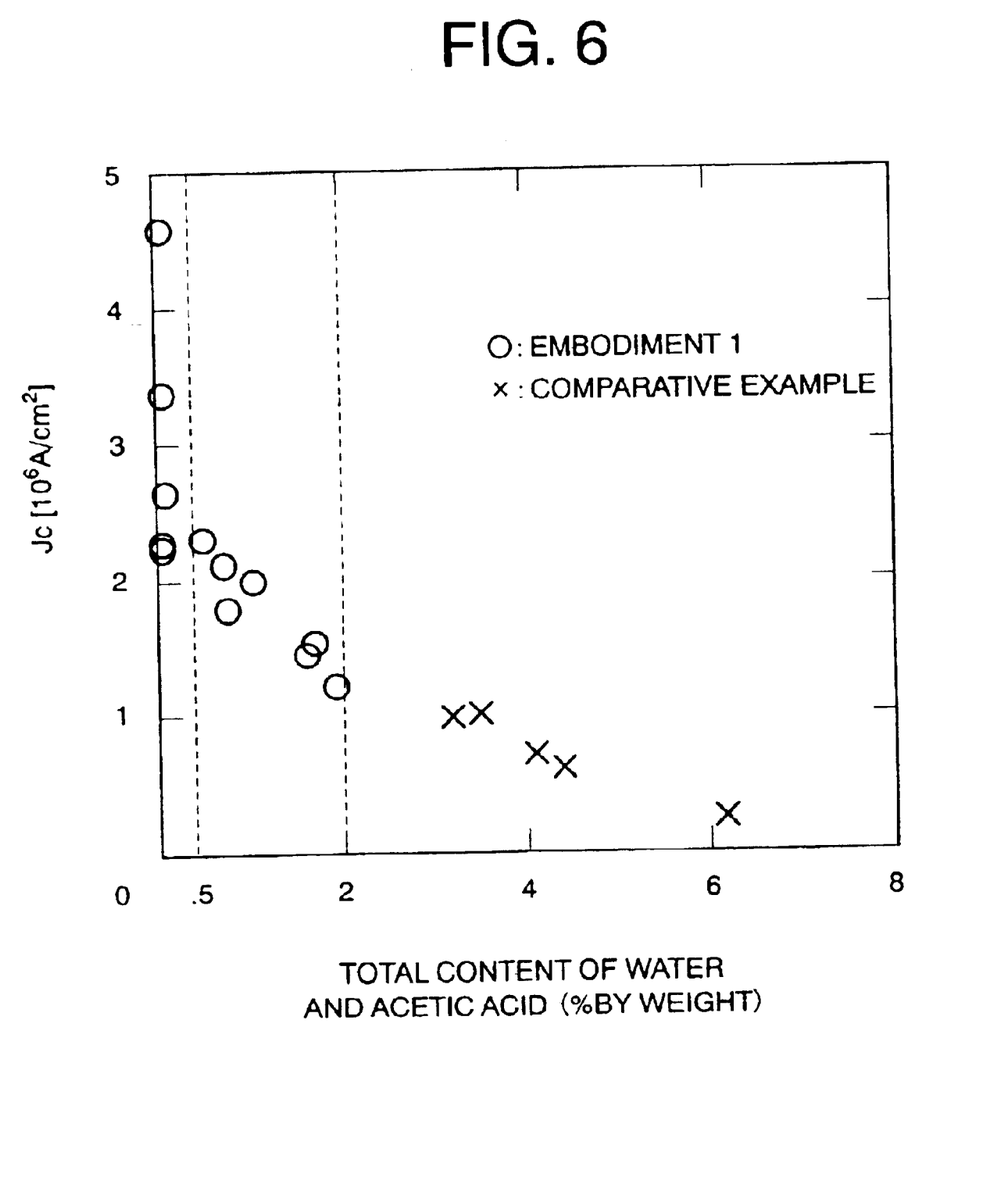
FIG. 6 is a graph showing relationship between a total content of water and acetic acid and critical current density in one embodiment of the present invention, together with that of a comparative example.

FIG. 5 shows measurements of X-ray diffraction, FIG. 6 measurements of the critical current density. In the figures, as a comparative example, the superconductor is employed that is prepared without implementing S14 and S15 in FIG. 1.

In FIG. 5, abscissa shows an angle of diffraction 2θ when Cu K-α line is used as-x-rays, ordinate diffraction intensity (arbitrary unit), upper step Embodiment 1, lower step Comparative Example. Both Embodiment 1 and Comparative Example show approximately identical diffraction patterns, thereby the crystal structure of the Y123 system superconductor being confirmed to be formed.

FIG. 6 is a graph where abscissa shows the total content of the water and acetic acid in the second purified mixed metal trifluoroacetate before the preparation of the coating solution, ordinate the critical current density (Jc). Circles denote plots of Embodiment 1, crosses plots of Comparative Example. A thickness of the superconductor is 0.15 μm in all samples.

In the Comparative Example, the total contents of the water and acetic acid are in the range from 3 to 6% by weight, whereas in the Embodiment 1, the total contents are less than 2% by weight, there being even ones of less than 0.5% by weight. That is, by means of the preparation process of the superconductor in which steps 14 and 15 in FIG. 1 are omitted, the purified mixed metal trifluoroacetate of which total content of the water and acetic acid is less than 2% by weight is not prepared.

The critical current density shows larger values as the total content of the water and acetic acid becomes smaller. In the comparative Example where the total content of the water and acetic acid in the purified mixed metal trifluoroacetate exceeds 2% by weight, the critical current density is approximately $1 \times 10^6$ (A/cm$^2$) at best, whereas in the Embodiment 1 where the total content is less than 2% by weight, the critical current density exceeds $1 \times 10^6$ (A/cm$^2$). Furthermore, when the total content is less than 0.5% by weight, there is a case showing a value approaching $5 \times 10^6$ (A/cm$^2$).

From the above, it is found that between Embodiment 1 and Comparative Example, there is almost no variation in the crystal structure itself, whereas there is the difference in the critical current density, that is, the critical current density is dependent on the total content of the water and acetic acid. It is considered that when the superconductor is formed, the water and acetic acid, in particular the acetic acid plays a role of impurity in the crystal structure to block a supercurrent.

(2) Embodiment 2

In Embodiment 2, similarly as Embodiment 1, as the starting materials, yttrium acetate, barium acetate and copper acetate are employed. Steps S11 through S13 are implemented in the same way as Embodiment 1.

Thereafter, in steps 14 and 15, ethanol is employed in the place of methanol to dissolve and purify the first purified mixed metal trifluoroacetate.

Specifically, in the step 14, ethanol of from 50 to 100 times the weight of the total content of the water and acetic acid in the first purified mixed metal trifluoroacetate is added. The obtained solution is distilled by means of the rotary evaporator under a reduced pressure for 10 hr to obtain second purified mixed metal trifluoroacetate (step S15). The longer distillation time corresponds to a lower vapor pressure of ethanol than that of methanol.

The obtained second purified mixed metal trifluoroacetate, similarly as Embodiment 1, is diluted by methanol to prepare a coating solution of 1.52 M (mol/l) in terms of metal ion (step S16).

Thereafter, by the approximately similar process as the first Embodiment, a superconductor is prepared (steps S17 to S9). The humidity of the humidified pure-oxygen atmosphere when preparing the superconductor precursor instep S18 is set at 12.1%, the base material and coating conditions in step 517 and heat treatment and annealing conditions in step S19 are the same as Embodiment 1.

The critical current density of thus prepared superconductor is measured under the conditions of a temperature of 77 K and no magnetic field. Superconductivity of 3.5 MA/cm$^2$ as Embodiment 1 is obtained.

(3) Embodiment 3

In Embodiment 3, hydrates of samarium acetate, barium acetate and copper acetate are employed as the starting materials. These are dissolved in deionized water to prepare an aqueous solution of mixed metal acetate with a mole ratio of 1:2:3 of metal ions Sm, Ba and Cu, respectively (step S11). The subsequent steps S12 to S13 are implemented in the same way as Embodiment 1.

Thereafter, in steps S14 and 15, with 1-propanol and 2-propanol respectively in the place of methanol, the first purified mixed metal trifluoroacetate is dissolved and purified.

Specifically, 1-propanol or 2-propanol of 50 times the total content of the water and acetic acid in the first purified mixed metal trifluoroacetate is added respectively to prepare two kinds of mixed metal trifluoroacetate solutions (step S14). The solutions each are distilled by means of the rotary evaporator under a reduced pressure for 12 hr to prepare two kinds of second purified mixed metal trifluoroacetate (step S15). Lower vapor pressure of propanol than that of methanol or ethanol lengthens the distillation time.

Obtained two kinds of second purified mixed metal trifluoroacetate are, similarly as Embodiment 1, diluted in methanol to prepare a coating solution of 1.50 M (mol/l) in terms of metal ion (step 516).

Thereafter, as approximately identically as Embodiment 1, a superconductor is prepared (steps S17 to S19). The base material used in step S17 is (100) oriented magnesia (MgO) on a surface there of a crystal line layer of CeO, is grown. Furthermore, in the preparation of the superconductor precursor in step S18, the humidity of the humidified pure oxygen atmosphere is set at 4.2%. In the preparation of the superconductor in step S19, the atmosphere gas is a gas mixture (1000 ppm oxygen is mixed with argon) of which humidity is 12.1%. The coating conditions in step S16 are the same as Embodiment 1.

Two kinds of superconductors thus prepared are measured of the critical current density, 1.50 MA/cm$^2$ and 1.14 MA/cm$^2$ being obtained under the conditions of a temperature of 70 K and no magnetic field, respectively.

(4) Embodiment 4

In Embodiment 4, similarly as Embodiment 1, with hydrates of yttrium acetate, barium acetate and copper acetate as the starting materials, under steps S12 and S13 approximately identical as Embodiment 1, a first purified mixed metal trifluoroacetate is prepared. The distilling time in step S13 is set at 14 hr a little bit longer than Embodiment 1.

Thereafter, in steps S14 and S15, methanol equivalent to 200 times the total content of the water and acetic acid in the first purified mixed metal trifluoroacetate is added to dissolve and purify. At that time, the distilling time is set at 9 hr.

obtained second purified mixed metal trifluoroacetate, similarly as Embodiment 1, is diluted by methanol to prepare a coating solution of 2.34 M (mol/l) in terms of metal ion (step S16). [0125] Thereafter, under the approximately identical processes as Embodiment 1, a superconductor is prepared (steps S17 to S19). The base material used in step S17 is (100) oriented yttria stabilized zirconia (YSZ) with a crystalline surface layer of ceria ($CeO_2$). The humidity of the humidified pure oxygen gas atmosphere in the preparation of the superconductor precursor in step 518 is set at 7.1%. The humidity of the humidified mixed gas atmosphere (1000 ppm oxygen gas mingled argon gas) in the preparation of the superconductor in step S19 is set at 4.2%. The conditions for coating in step S17 are set identical as Embodiment 1.

The critical current density of thus prepared superconductor is measured under the conditions of a temperature of 77 K and no magnetic field. Superconductivity of 3.6 $MA/cm^2$ excellent as Embodiment 1 is obtained.

As will be apparent to those skilled in the art and familiarized with the instant disclosure, certain variations in formulation and processing steps may occur without departing from the spirit of the invention. Accordingly, the invention is to be broadly construed within the scope of the appended claims.

What is claimed is:

1. A method for preparing raw material for an oxide superconductor, comprising:

mixing an aqueous solution of mixed metal acetate containing barium, copper, and one or more metal element selected from the group consisting of lanthanide and yttrium, with trifluoroacetic acid to prepare an aqueous solution of mixed metal trifluoroacetate;

a first refining process in which the aqueous solution of mixed metal trifluoroacetate is refined under a reduced pressure to prepare a first purified mixed metal trifluoroacetate in which water and acetic acid are reduced;

adding a substance capable of replacing the water and acetic acid in the first purified mixed metal trifluoroacetate to the first purified mixed metal trifluoroacetate; and a second refining process in which the first purified mixed metal trifluoroacetate, to which the replaceable substance is added, is refined under a reduced pressure to prepare a second purified mixed metal trifluoroacetate in which water and acetic acid is 2% or less by weight.

2. A method for preparing raw material for an oxide superconductor as set forth in claim 1:

wherein the one or more metal element is selected from the group consisting of yttrium, neodymium, samarium, gadolinium, and ytterbium.

3. A method for preparing raw material for an oxide superconductor as set forth in claim 1:

wherein a total content of water and acetic acid contained in the mixed metal trifluoroacetate is 0.5 percent by weight or less.

4. A method for preparing an oxide superconductor as set forth in claim 1:

wherein the replaceable substance includes a hydrocarbon that is liquid at a temperature of 30° C. and a pressure of 1013 hPa.

5. A method for preparing an oxide superconductor as set forth in claim 4:

wherein the replaceable substance is selected from the group consisting of methanol, ethanol, 1-propanol, and 2-propanol.

* * * * *